US012604428B2

(12) United States Patent
Tseng et al.

(10) Patent No.: US 12,604,428 B2
(45) Date of Patent: Apr. 14, 2026

(54) INFORMATION HANDLING SYSTEM BEZEL LATCH AND LOCK

(71) Applicant: Dell Products L.P., Round Rock, TX (US)

(72) Inventors: Chuan Chieh Tseng, Taipei (TW); Jen-Chun Hsueh, New Taipei City (TW); Lawrence Ying-Hsi Lin, Taipei (TW)

(73) Assignee: Dell Products L.P., Round Rock, TX (US)

( * ) Notice: Subject to any disclaimer, the term of this patent is extended or adjusted under 35 U.S.C. 154(b) by 185 days.

(21) Appl. No.: 18/393,877

(22) Filed: Dec. 22, 2023

(65) Prior Publication Data

US 2025/0212351 A1     Jun. 26, 2025

(51) Int. Cl.
*H05K 7/14* (2006.01)
(52) U.S. Cl.
CPC ......... *H05K 7/1402* (2013.01); *H05K 7/1488* (2013.01)
(58) Field of Classification Search
None
See application file for complete search history.

(56) References Cited

U.S. PATENT DOCUMENTS

| | | | |
|---|---|---|---|
| 7,602,605 B2 | 10/2009 | Su et al. | |
| 8,649,180 B2 | 2/2014 | Grady et al. | |
| 9,125,050 B2 | 9/2015 | Taylor et al. | |
| 10,251,299 B1 * | 4/2019 | Wang | E05C 9/026 |
| 10,324,503 B1 * | 6/2019 | O'Donnell | H05K 9/0062 |
| 11,412,633 B2 * | 8/2022 | Zhong | G06F 1/181 |
| 11,723,167 B2 * | 8/2023 | Chen | G06F 1/181 |
| | | | 361/679.02 |
| 2011/0279973 A1 | 11/2011 | Terwilliger et al. | |
| 2015/0062796 A1 * | 3/2015 | Yu | H05K 5/0221 |
| | | | 49/460 |

* cited by examiner

*Primary Examiner* — James Wu
*Assistant Examiner* — Christopher L Augustin
(74) *Attorney, Agent, or Firm* — Zagorin Cave LLP; Robert W. Holland

(57) ABSTRACT

An information handling system bezel latches to an information handling system housing with latches coupled to a slot structure that slides relative to the bezel. The slot structure has a slot through which a lock couples so that the slot structure slides relative to the lock when the lock is in an unlocked position. When the lock is in the locked position, a lock member rotates to an axis that the slot structure slides along to engage a stop formed in the bezel so that the slot structure is prevented from sliding without generating torsional forces when a sliding force is pressed against the sliding structure.

15 Claims, 8 Drawing Sheets

INFORMATION HANDLING SYSTEM BEZEL LATCH AND LOCK

BACKGROUND OF THE INVENTION

Field of the Invention

The present invention relates in general to the field of information handling system security, and more particularly to an information handling system bezel lock and latch.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems generally process information with processing components coupled inside of a housing. Some information handling systems have housing located in a fixed location, such as desktop, tower and server information handling systems. Server information handling systems in particular tend to have a secure location with well-regulated power and thermal environments. For example, server information handling systems are often vertically stacked in racks that slide the housing into and out of an interior, such as with rails coupled to the rack. Within the rack interior, the information handling system is provided with power and communication cables. Treated cooling air is typically blown at one side of the rack to flow through the housing and then exhausted at the other side of the rack. At the front face of the housing, a server information handling system will often have a bezel that passes the cooling airflow and a lock that physically prevents unauthorized access to the housing interior.

A typical bezel lock has a lock pawl included in the bezel that is rotated between locked and unlocked positions. In the locked position, a lock pawl arm interacts with a latch to stop latch travel so that the latch remains engaged with housing to prevent movement of the bezel to an open position. One difficulty with conventional bezel locks is that, in a locked position when the release button is pressed a noticeable gap becomes apparent even though the latch is locked. The amount of gap can increase over time and lock actuations as the end user torque on the lock pawl offsets the lock and loosens with wear. The gap that shows when the latch is pressed against the lock can result in end user confusion as to whether the bezel is locked or unlocked. When the latch presses asymmetrically against the lock, torsional forces can result in unbalanced movement of the latch, such as when an end user presses on one side of the latch instead of at a middle position. In some instances, partial rotation of the pawl lock can leave sufficient room for the latch to release even though an end user intended for the bezel to remain locked. For instance, the bezel lock key might release from the keyhole without full rotational travel and leave the lock partially rotated.

SUMMARY OF THE INVENTION

Therefore, a need has arisen for a system and method which locks a bezel to an information handling system without introducing torsional force when the bezel latch is actuated.

In accordance with the present invention, a system and method are provided which substantially reduce the disadvantages and problems associated with previous methods and systems for locking a bezel latched to an information handling system housing. A lock inserts through a slot of a slot structure that couples to latches that engage the housing. The slot structure slides along an axis relative to the lock when the lock is in an unlocked position. A member of the lock in a locked position rotates to the sliding axis to engage against a stop of the bezel without introducing torsional forces when actuated.

More specifically, an information handling system server rack supports plural server information handling systems with chassis housings coupled by rails to slide into and out of the rack. A bezel latches to the front of each information handling system chassis housing and to the rack so that the chassis housing is latched to the rack and secured from removal. The bezel includes a lock assembly having a lock that rotates between a locked position and an unlocked position. In an unlocked position, a handle at the exterior of the bezel is pressed along a sliding axis to translate movement to a slot structure of the latch so that the latch slides to a retracted position that allows removal of the bezel and/or release of the bezel from the rack. The lock inserts through a slot of the slot structure with a pin and slot arrangement to support sliding movement along the sliding axis. When the lock rotates to a locked position, a member of the lock aligns with the sliding axis and engages against the bezel to prevent sliding movement of the slot structure. The slot structure has upper and lower arms that meet at a slot that accepts the lock in a middle position. The middle position of the lock and the sliding axis orientation of the lock member cooperate to prevent sliding of the latch when the lock is in a locked position without introducing torsional forces.

The present invention provides a number of important technical advantages. One example of an important technical advantage is that an information handling system bezel couples to an information handling system housing with a latch that slides between latched and unlatched positions to release and latch the bezel with minimal incidental movement and gaps. A lock member in a locked position engages against the bezel along a sliding axis of a slot structure midway between arms that hold a slot in which the lock fits so that a press against the slot structure does not introduce torsional forces. The lock assembly has a reduced part count with simplified latch and unlatch movements and well defined latched and unlatched handle positions.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An information handling system bezel couples to a housing with a latch released by sliding motion along an axis and locked by a lock member engaged against the bezel along the axis to avoid introduction of torsional force by a press against the latch. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
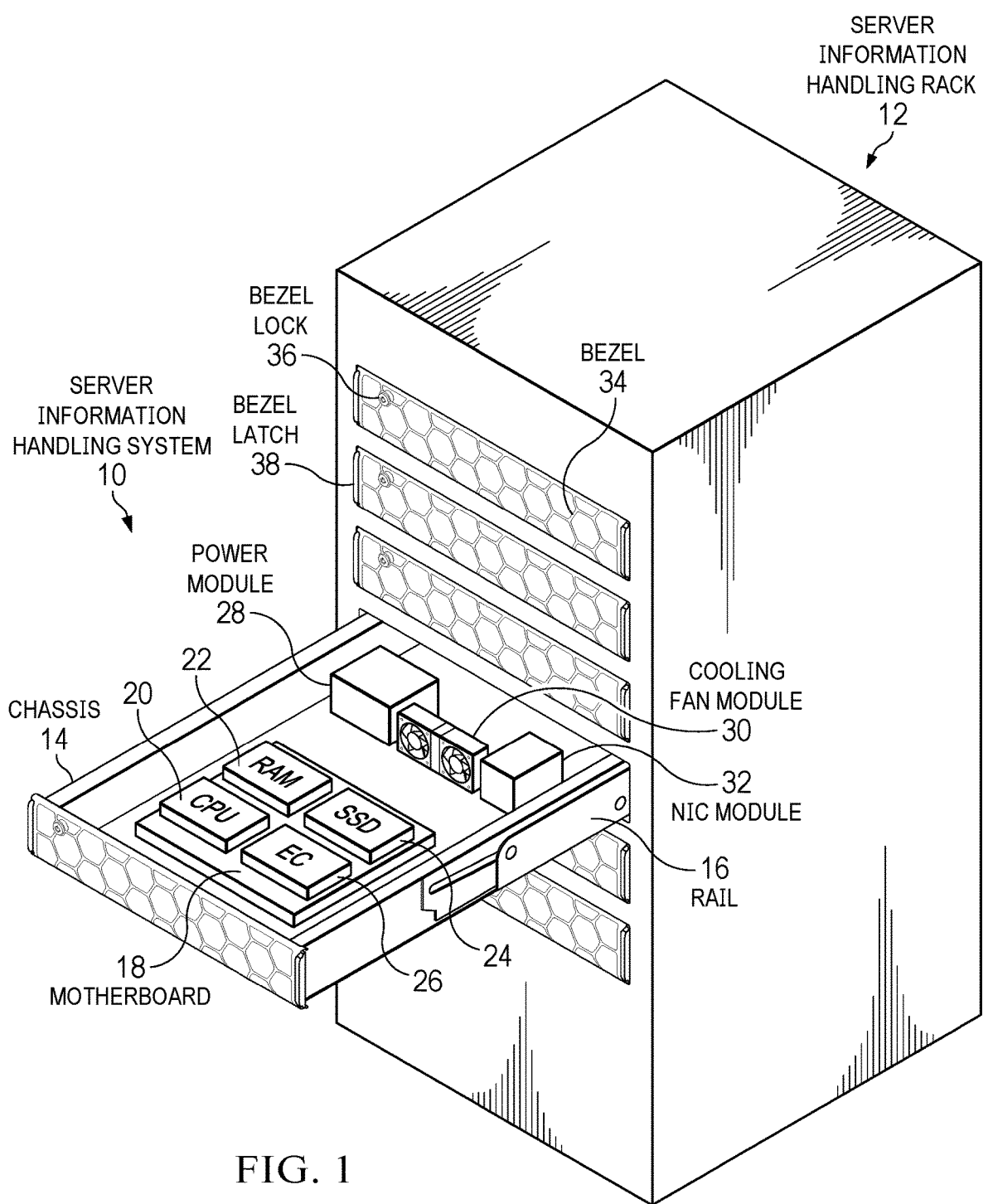
FIG. 1 depicts server information handling systems coupled in a rack and secured by a bezel having a latch and lock.

Referring now to FIG. 1, server information handling systems 10 couple in a rack 12 secured by a bezel 34 having a handle 38 interfaced with a latch and a lock 36. In the example embodiment, each server information handling system 10 is built in a chassis housing 14 to slide in and out of rack 12 by rails 16. A motherboard 18 couples to chassis housing 14 to support communication between processing components that cooperate to process information. For example, a central processing unit (CPU) 20 executes instructions to process information in cooperation with a random access memory (RAM) 22 that stores the instructions and information. A solid state drive (SSD) 24 has persistent storage to store instructions during system power down, such as an operating system and applications that execute on CPU 20. An embedded controller 26 manages system operations, such a power and thermal constraints related to a power module 28 and cooling module 30. A network interface controller (NIC) module 32 provides network communications, such as through local area network.

Server information handling systems 10 often manage sensitive information and functions so that physical security is desired to protect against unauthorized access of the processing components. To secure a chassis housing 14 internally within rack 12, a bezel 34 is latched by a bezel latch handle 38 interfaced with an internal latch that couples to the rack front face. In the example embodiment, when the bezel latches to both the housing front face and the rack, the bezel holds the housing internal to the rack to prevent rails 16 from extending the housing so that access to the processing components is prevented. Bezel 36 is secured to chassis housing 14 by the latch interfaced with handle 38, which is in turn locked into place by bezel lock 36 so that the latch cannot be actuated to release the bezel. The example embodiment provides a press latch that actuates in a simple and secure manner in cooperation with the lock so that unauthorized access to an information handling system 10 is prevented.

Figure 2:
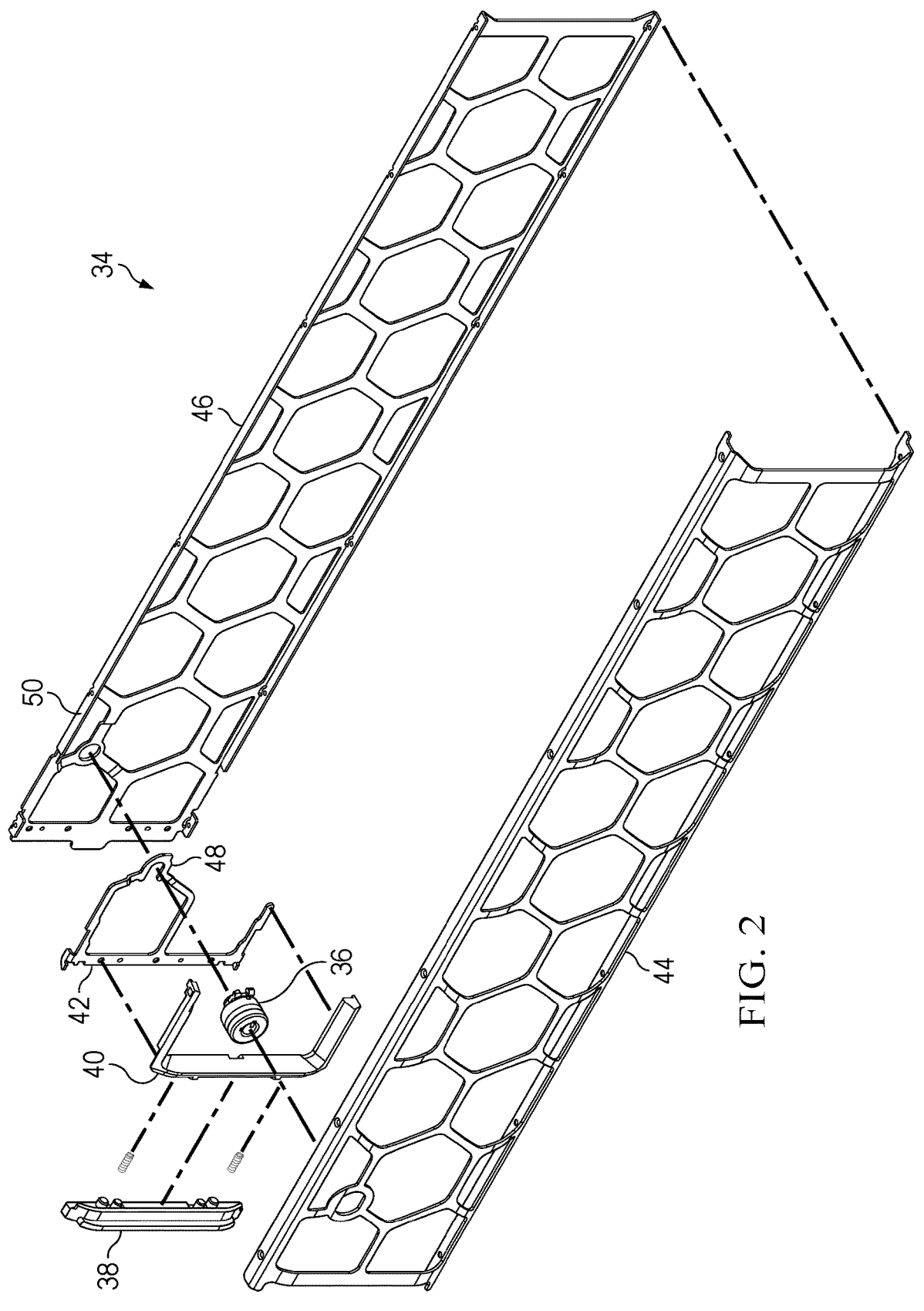
FIG. 2 depicts an exploded perspective view of a bezel that includes a lock assembly to selectively prevent and allow actuation of a latch to secure and release an information handling system housing.

Referring now to FIG. 2, an exploded perspective view depicts a bezel 34 that includes a lock assembly to selectively prevent and allow actuation of a latch 42 to secure and release an information handling system housing. Bezel 34 has an outer portion 44 coupled to an inner portion 46 to capture the lock assembly between them. A latch handle 38 couples to a rail support 40 to be exposed at an edge of bezel outer portion 44 and to engage with latch 42. Rail support 40 couples in a fixed position at bezel outer portion 44 to accept latch 42 in a sliding relationship against bezel inner portion 46. Bezel lock 36 fits in opening of bezel 34 and through a slot of slot structure 48 to rotate between locked and unlocked positions. In the unlocked position, slot structure 48 slides relative to rail support 40 to move latch 42 into and out of the interior defined by bezel outer portion 44 and bezel inner portion 46. When latch 42 extends out of the interior, it engages against the chassis housing to latch bezel 34 in place. When latch 42 is pressed into the interior by actuation of handle 38, bezel 34 is released from the chassis housing to allow removal from the rack. In the locked position, a member of lock 36 rotates to align with a stop structure 50 formed in bezel inner portion 46 to prevent sliding of latch 42 by handle 38.

Figure 3:
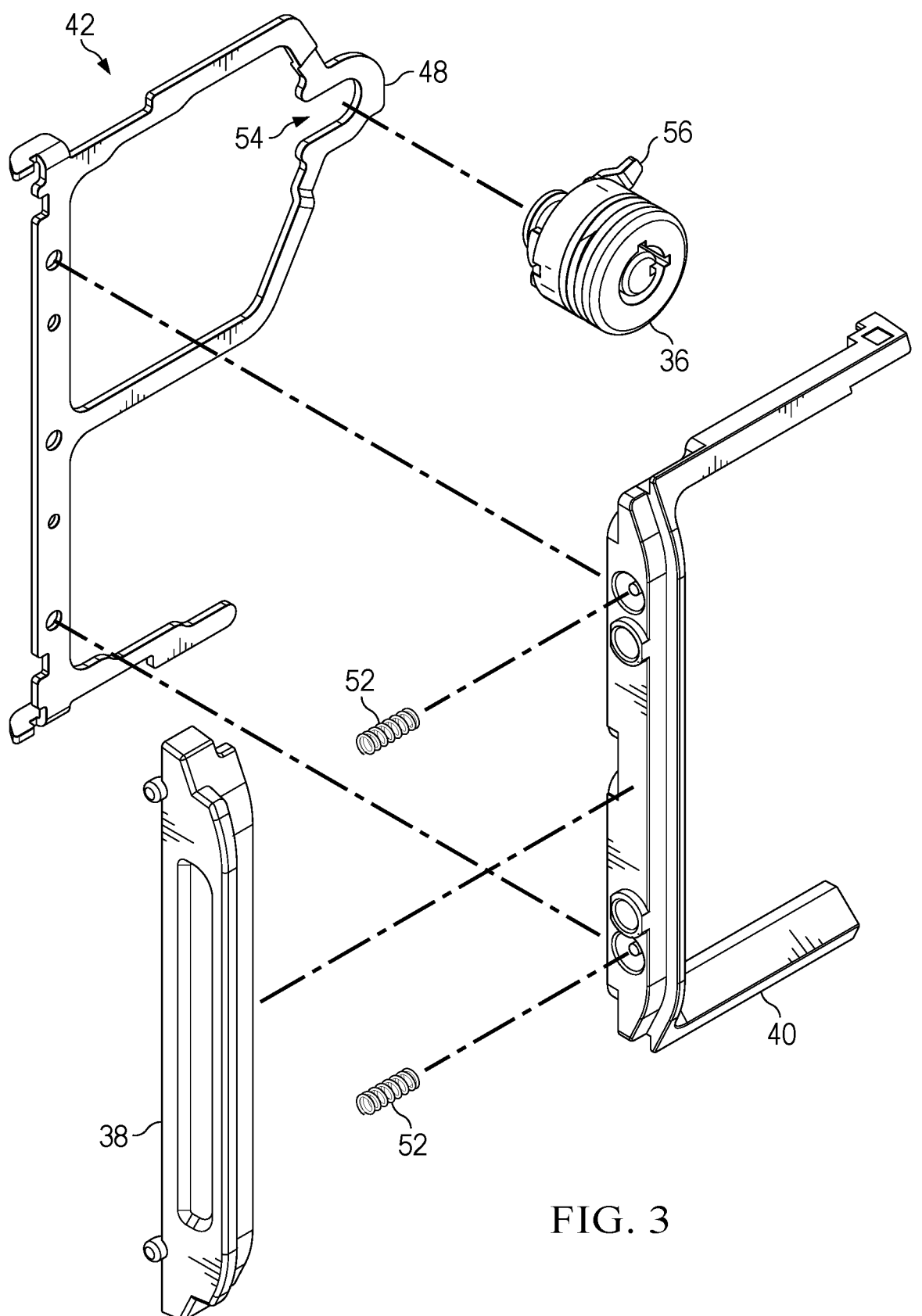
FIG. 3 depicts a side perspective exploded view of the lock assembly.

Referring now to FIG. 3, a side perspective exploded view depicts the lock assembly. Handle 38 couples to rail support 40 with springs 52 inserted to bias handle 38 outward. Handle 38 engages with latch 42 at an interior side so that latch 42 slides along a sliding axis in cooperation with handle 38. Lock 36 inserts into a slot 54 of slot structure 48 to rotation between locked and unlocked positions. Lock member 56 extends out from lock 36 to engage with the bezel stop in the locked position. Slot structure 48 has upper and lower parallel arms configured so that slot 54 is defined in a middle position between the parallel arms. The middle position of slot 54 aligns an end of slot structure 48 with the bezel stop so that torsional forces are not introduced when the end hits the stop upon sliding along the sliding axis. Similarly, when member 56 of lock 36 rotates to align with the sliding axis, member 56 engages against the bezel stop structure without introducing torsional forces.

Figure 4:
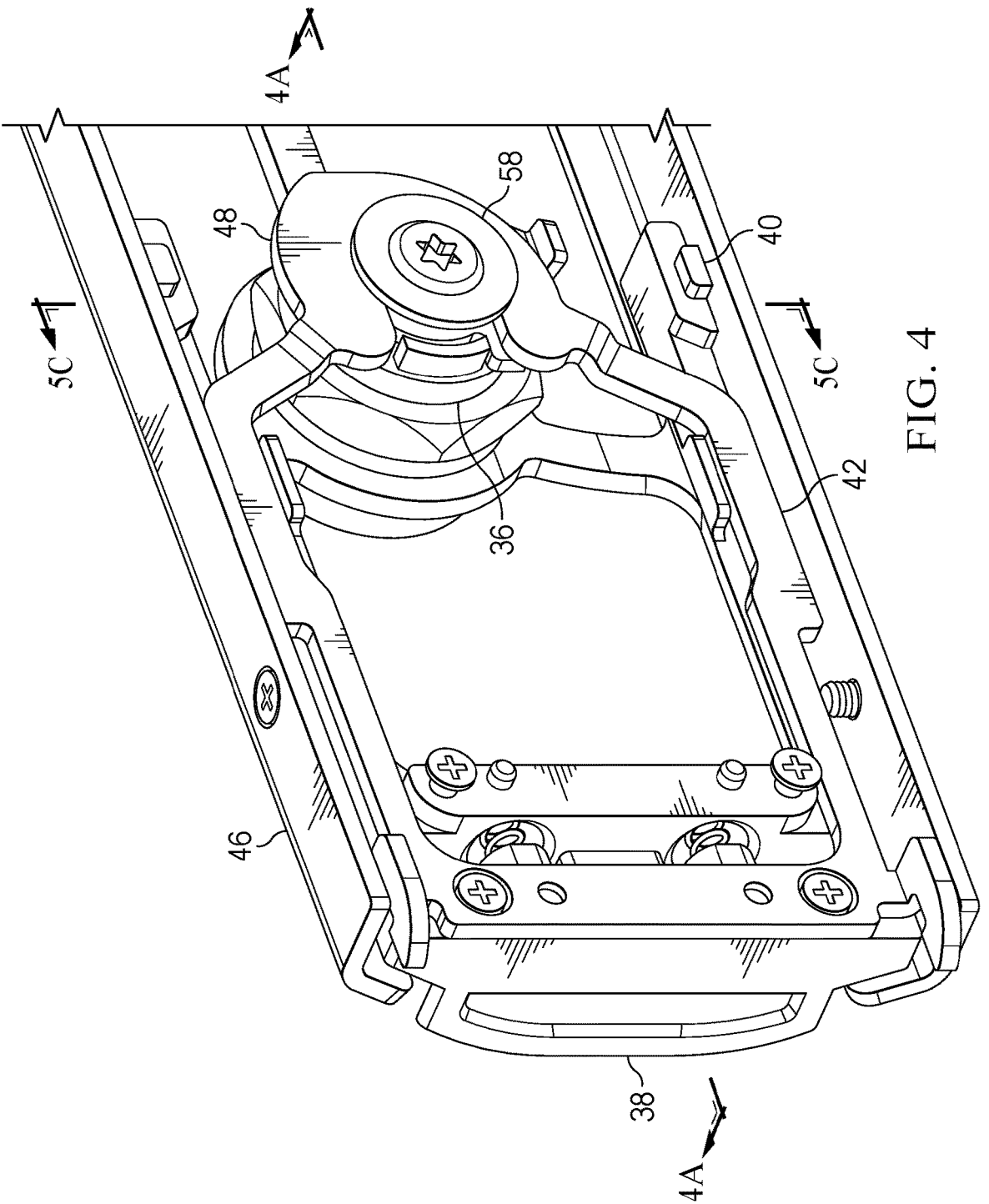
FIGS. 4 and 4A depict a rear side perspective view of the latch assembly coupled within the bezel outer portion.
Figure 4A:
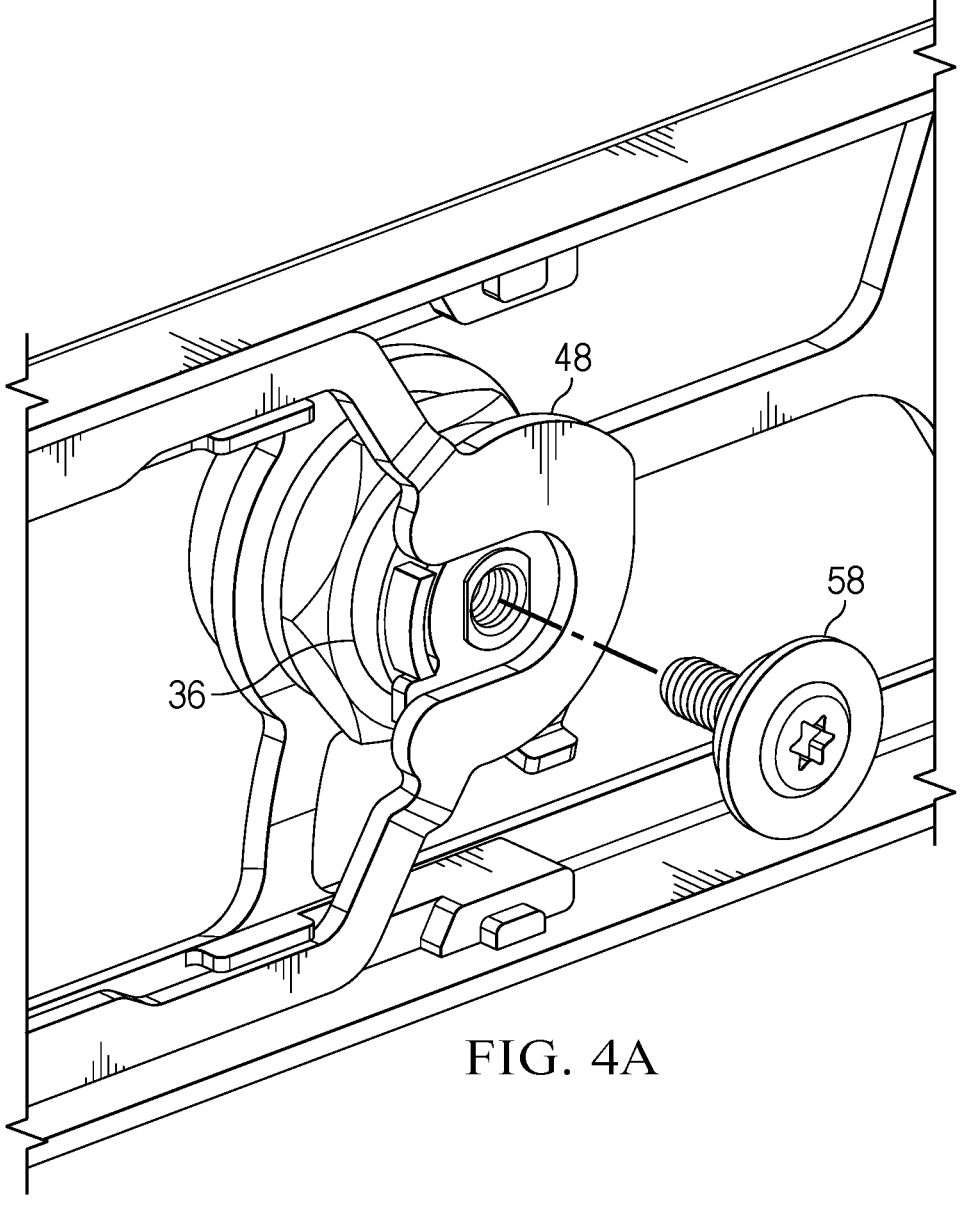

Referring now to FIGS. 4 and 4A, a rear side perspective view depicts the latch assembly coupled within the bezel outer portion 46. Handle 38 couples to latch 42 with a set of screws so that a press inward of handle 38 translates to slide latch 42 along a sliding axis inward to retract the latch ends from engagement with an information handling system housing. Latch 42 has sliding motion defined by a rail section at the upper and lower parallel arms that inserts into rail support 40. A pin 58, such as a threaded screw, couples to lock 36 within the slot of slot structure 48 to support sliding motion of latch 42 when lock 36 is in an unlocked position. FIG. 4A depicts pin 58 exploded out from lock 36. Slot structure 48 has a flat surface where pin 58 couples to lock 36 that supports sliding motion slot structure 48 relative to lock 36 when in the unlocked position.

Figure 5A:
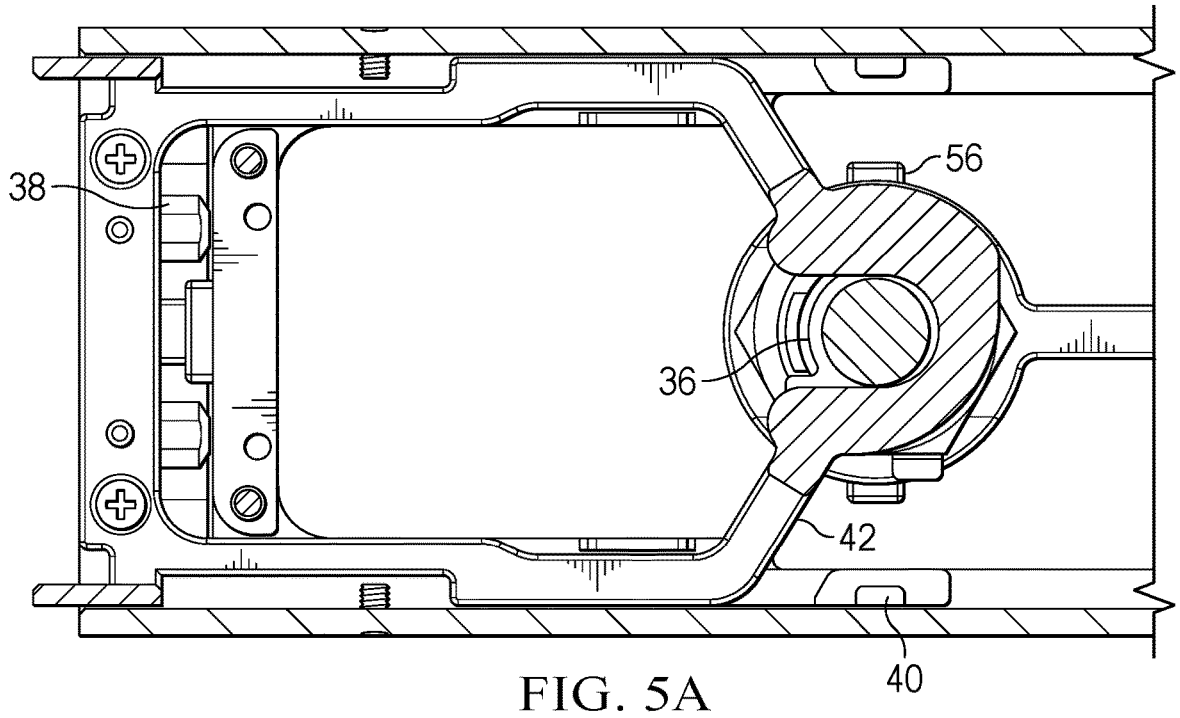
FIGS. 5A, 5B and 5C depict the sliding motion of the slot structure relative the lock when the lock is in an unlocked position.
Figure 5B:
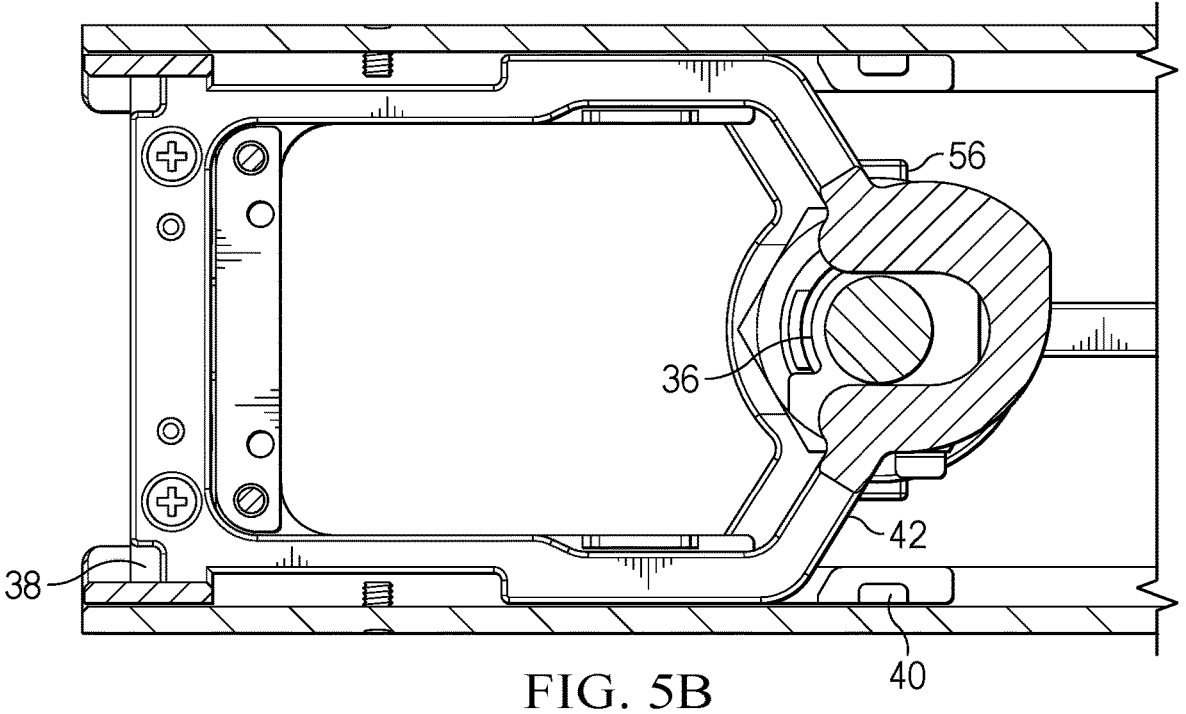
Figure 5C:
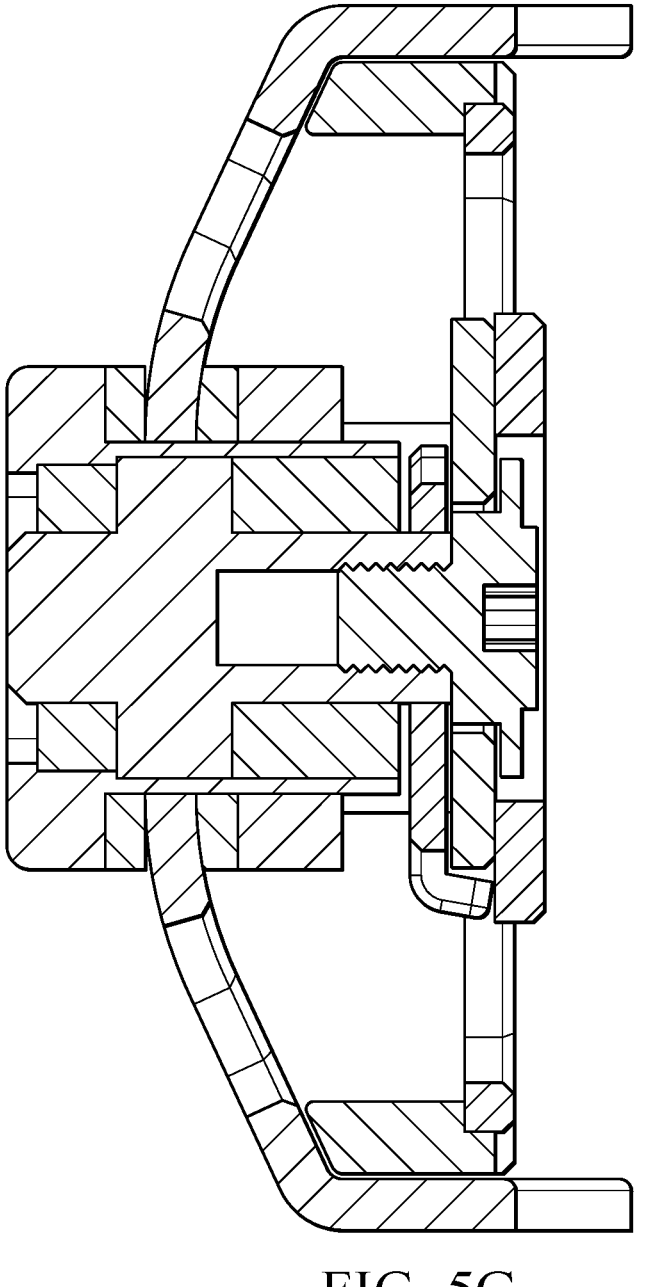

Referring now to FIGS. 5A, 5B and 5C, the sliding motion of the slot structure relative the lock when the lock is in an unlocked position is depicted. FIG. 5A depicts a rear side sectional view of the lock assembly with handle 38 extended out and latch 42 slid on the sliding axis to a latched position. Lock 36 is rotated to the unlocked position having lock member 56 directed off of the sliding axis and the slot structure free to slide to the unlatched position. FIG. 5B depicts a rear sectional view of the lock assembly with handle 38 actuated to slide inward so that latch 42 is retracted. The sliding structure slides relative to lock 36 within rail support 40 along a sliding axis. FIG. 5C depicts a cross sectional view of the lock and pin at the slot to illustrate sliding of the sliding structure when in the unlocked position.

Figure 6A:
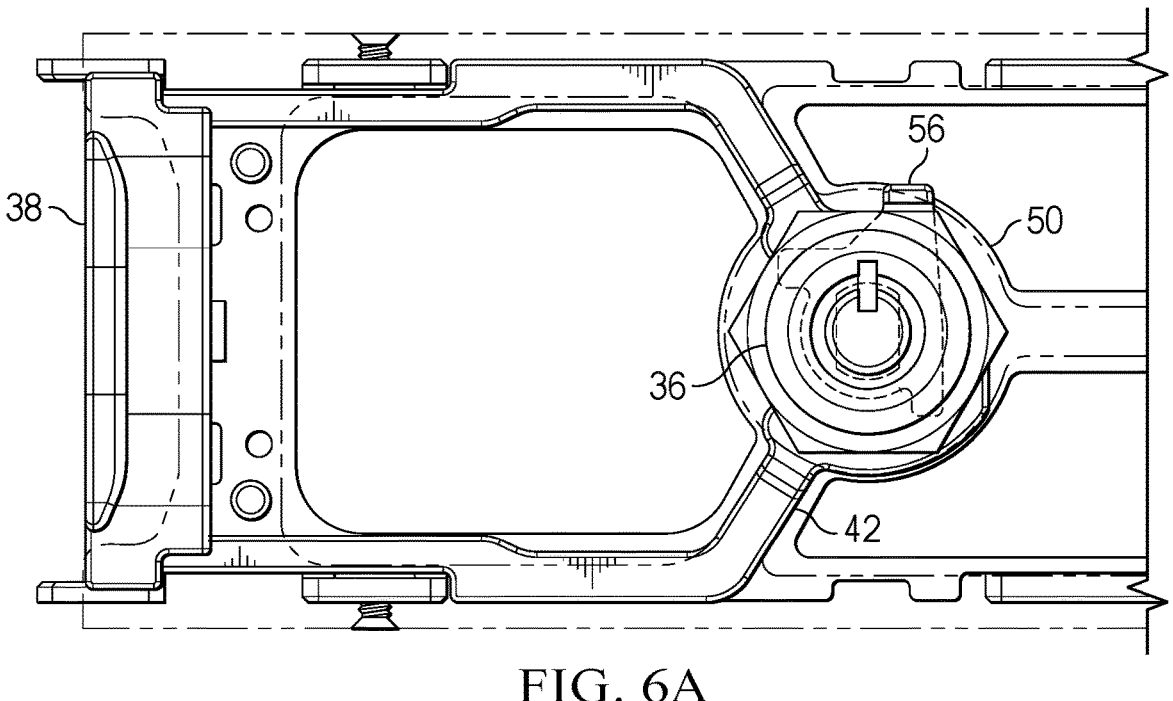
FIGS. 6A and 6B depict the lock rotated from an unlocked position to a locked position that prevents sliding motion of the slot structure.
Figure 6B:
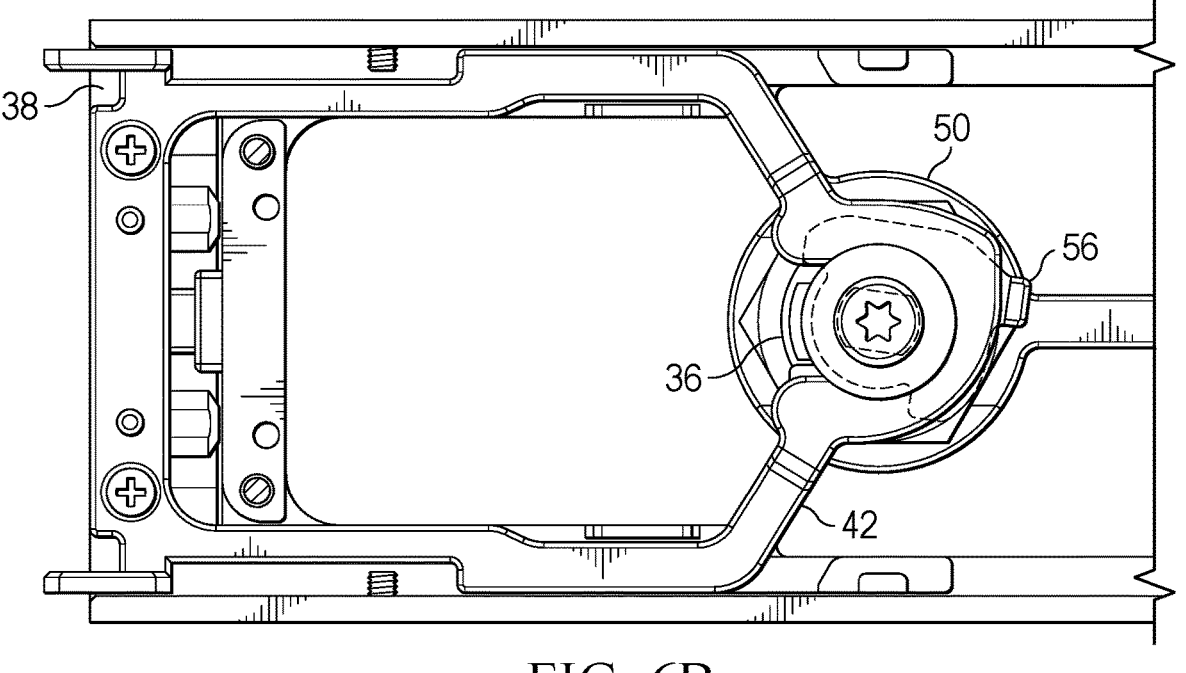

Referring now to FIGS. 6A and 6B, the lock is depicted rotated from an unlocked position to a locked position that prevents sliding motion of the slot structure. FIG. 6A depicts a front sectional view of the lock assembly in an unlocked position with latch 42 in a latched position slid along the sliding axis to a full left position. A stop structure 50 formed in the bezel provides room for latch 42 to slide with lock member 56 rotated to an upward position. FIG. 6B depicts a rear sectional view of latch 42 with lock 36 rotated to a locked position having lock member 56 aligned with the sliding axis to engage against stop 50 so that latch 42 is prevented from sliding to the unlatched position. Lock 36 is in a middle position between upper and lower arms of the slot structure so that a press against handle 38 is evenly distributed to avoid generation of tortional forces by inter-action of lock member 56 against stop structure 50. Handle 38 remains biased outward by the springs located within the rail support and does not slide partially towards the unlatched position so that an end user has a clear presenta-tion of the bezel latched and locked state.

Although the present invention has been described in detail, it should be understood that various changes, substi-tutions and alterations can be made hereto without departing from the spirit and scope of the invention as defined by the appended claims.

What is claimed is:

1. An information handling system comprising:
a housing;
a processor coupled within the housing and operable to execute instructions that process information;
a memory coupled within the housing and interfaced with the processor, the memory operable to store the instruc-tions and information;
a bezel coupled to the housing;
a lock assembly coupled to the bezel, the lock assembly sliding along an axis between a locked position that latches the bezel to the housing and an unlocked position that releases the bezel from the housing, the lock assembly having a lock that rotates to a locked position having a member engaged against the bezel along the axis to resist the sliding without torsional force;

first and second parallel arms, each terminating at one end with a latch;
a slot structure coupled in a middle position to the first and second parallel arms opposite the latch and sized to accept the lock;
an upper rail formed in a first side of the bezel;
a lower rail formed in the first side of the bezel; and
a rail support coupled to a second side of the bezel, the upper rail, lower rail and slot structure, the rail support capturing the first and second parallel arms in a sliding relationship.

2. The information handling system of claim 1 further comprising a pin engaged through the lock at the slot structure, the slot structure sliding relative to the pin and lock when the lock rotates to an unlocked position.

3. The information handling system of claim 2 further comprising a latch handle coupled to the first and second parallel arms to push the slot structure to slide relative to the pin.

4. The information handling system of claim 3 wherein the latch handle couples to the rail support to engage with the first and second parallel arms.

5. The information handling system of claim 4 wherein the bezel comprises a outer portion and a inner portion, the rail support captured between the outer portion and the inner portion.

6. The information handling system of claim 1 further comprising:
a lip formed in the bezel proximate the lock;
wherein the lock member engages against the lip when the lock rotates to the locked position to prevent sliding of a slot structure.

7. The information handling system of claim 6 wherein the lip limits travel of the slot structure when the lock rotates to the unlocked position.

8. A method for securing an information handling system, the method comprising:
latching a bezel to a housing of the information handling system;
rotating a lock of the bezel to a locked position having a lock member aligned along a sliding axis to engage against a stop position of the bezel to prevent sliding of a slot structure;
rotating the lock of the bezel to an unlocked position freeing the slot structure to slide in a slot of the slot structure along the sliding axis relative to the lock and release the latching;
coupling the slot structure to the lock with a pin inserted through a slot of the slot structure into the lock; and
sliding the slot structure relative to the lock at the slot by engagement of the pin and lock through the slot.

9. The method of claim 8 further comprising:
engaging the slot structure with the bezel by first and second parallel arms; and
aligning the slot to accept the lock in a middle position between the first and second parallel arms.

10. The method of claim 9 further comprising:
coupling the slot structure between first and second por-tions of the bezel; and
engaging the slot structure with a handle exposed exterior to the bezel and configured to translate sliding move-ment to the slot structure.

11. The method of claim 10 further comprising:
moving the handle with the lock in an unlocked position; and
translating the moving to slide the slot structure relative to the lock.

12. The method of claim 11 further comprising:

restricting sliding motion of the slot structure when the lock is unlocked by engaging the slot structure against the stop position of the bezel.

13. The method of claim 12 further comprising:

coupling a rail support between the bezel portions;

coupling the handle to the rail support; and sliding that slot structure against the rail support.

14. A bezel comprising:

first and second bezel portions coupled together;

a lock assembly coupled between the first and second bezel portions, the lock assembly sliding along an axis between a locked position that latches the bezel to an information handling system housing and an unlocked position that releases the bezel from the information handling system housing, the lock assembly having a lock that rotates to a locked position having a member engaged against a stop formed in the first bezel portion along the axis to resist the sliding without torsional force;

first and second parallel arms, each terminating at one end with a latch; and a slot structure coupled in a middle position to the first and second parallel arms opposite the latch and sized to accept the lock;

an upper rail formed in the first bezel portion;

a lower rail formed in the first bezel portion; and a rail support coupled to the second bezel portion, the upper rail, lower rail and the slot structure, the rail support capturing the first and second parallel arms in a sliding relationship.

15. The bezel of claim 14 further comprising a pin engaged through the lock at the slot structure, the slot structure sliding relative to the pin and lock when the lock rotates to an unlocked position.

\* \* \* \* \*